United States Patent
Ryan

(10) Patent No.: US 7,619,459 B2
(45) Date of Patent: Nov. 17, 2009

(54) HIGH SPEED VOLTAGE TRANSLATOR CIRCUIT

(75) Inventor: Kevin Ryan, Colorado Springs, CO (US)

(73) Assignee: Aeroflex Colorado Springs Inc., Colorado Springs, CO (US)

(*) Notice: Subject to any disclaimer, the term of this patent is extended or adjusted under 35 U.S.C. 154(b) by 152 days.

(21) Appl. No.: 11/384,010

(22) Filed: Mar. 17, 2006

(65) Prior Publication Data
US 2007/0216443 A1    Sep. 20, 2007

(51) Int. Cl.
H03L 5/00       (2006.01)
H03K 3/00       (2006.01)
H03K 19/094     (2006.01)
H03K 19/0175    (2006.01)

(52) U.S. Cl. .................. 327/333; 327/112; 326/68; 326/83

(58) Field of Classification Search .............. None
See application file for complete search history.

(56) References Cited

U.S. PATENT DOCUMENTS

| | | | |
|---|---|---|---|
| 4,814,635 A | | 3/1989 | Allen et al. |
| 4,918,336 A | * | 4/1990 | Graham et al. ............... 326/117 |
| 5,034,635 A | | 7/1991 | Ten Eyck |
| 5,283,482 A | * | 2/1994 | Chen ........................... 326/66 |
| 5,287,536 A | | 2/1994 | Schreck et al. |
| 5,367,491 A | * | 11/1994 | Han et al. .................... 365/201 |
| 5,446,397 A | | 8/1995 | Yotsuyanagi |
| 5,488,321 A | * | 1/1996 | Johnson ......................... 327/66 |
| 5,805,005 A | * | 9/1998 | Raisinghani et al. ........ 327/333 |
| 5,952,865 A | | 9/1999 | Rigazio |
| 6,008,673 A | | 12/1999 | Glass et al. |
| 6,018,236 A | | 1/2000 | Keeth |
| 6,160,421 A | | 12/2000 | Barna |
| 6,232,801 B1 | | 5/2001 | Khoury et al. |
| 6,275,075 B1 | | 8/2001 | Min |
| 6,320,427 B1 | | 11/2001 | Shi et al. |
| 6,331,797 B1 | | 12/2001 | Lambert |
| 6,515,532 B2 | * | 2/2003 | Jinzai ......................... 327/333 |
| 6,518,816 B2 | | 2/2003 | Riccio et al. |

(Continued)

OTHER PUBLICATIONS

Hogervorst, R., Huijsing, J. H., "Design of Low-Voltage, Low-Power Operational Amplifier Cells", Kluwer Academic Publishers, 1996, pp. 165-167.

*Primary Examiner*—Rexford N Barnie
*Assistant Examiner*—Dylan White
(74) *Attorney, Agent, or Firm*—William J. Kubida; Scott J. Hawranek; Hogan & Hartson LLP

(57) ABSTRACT

A high speed voltage translator circuit includes a voltage divider coupled between first and second power supplies, a transconductance amplifier coupled between third and fourth power supplies including a non-inverting voltage input coupled to the voltage divider, an inverting voltage input for receiving an input signal, and a current output, and a current comparator coupled between the third and fourth power supplies having an input coupled to the current output of the transconductance amplifier, and an output for providing a translated output voltage. The translated output voltage transitions between the third and fourth power supply voltage levels, the third power supply voltage level being more positive than a first power supply voltage level, and the fourth power supply voltage level being more negative than a second power supply voltage level.

20 Claims, 3 Drawing Sheets

U.S. PATENT DOCUMENTS

| | | |
|---|---|---|
| 6,563,362 B2 | 5/2003 | Lambert |
| 6,617,915 B2 | 9/2003 | Rajan |
| 6,680,605 B2 | 1/2004 | Chen et al. |
| 6,774,698 B1 | 8/2004 | Bhattacharya et al. |
| 6,855,994 B1 | 2/2005 | King et al. |
| 6,970,022 B1 | 11/2005 | Miller |
| 2004/0085098 A1* | 5/2004 | Kajimoto ............... 327/78 |
| 2005/0146965 A1* | 7/2005 | Kim et al. ............... 365/211 |
| 2005/0162209 A1 | 7/2005 | Dubey et al. |
| 2006/0091951 A1* | 5/2006 | Abadeer et al. ......... 330/253 |

* cited by examiner

US 7,619,459 B2

HIGH SPEED VOLTAGE TRANSLATOR CIRCUIT

RELATED CASE INFORMATION

This case is related to my co-pending patent application Ser. No. 11/384,013, entitled "CURRENT COMPARATOR USING WIDE SWING CURRENT MIRRORS", filed on Mar. 17, 2006.

BACKGROUND OF THE INVENTION

Voltage translator circuits, and particularly CMOS voltage translator circuits, that have the ability to translate a digital input signal that switches between a first set of voltages (such as ground and three volts) to a digital output signal that switches between a second set of voltages (such as a voltage below ground and a voltage greater than three volts) are well known in the art. One typical application for translator circuits is to switch digital signals between logic families such as CMOS to TTL or ECL, or between any other logic families or circuits having voltage-incompatible logic levels. However, translator circuits are also used in many different functional blocks and applications, and then usually implemented in integrated circuits. In many applications the switching speed of the translator circuit is critical in achieving the overall performance goals for the corresponding functional block or integrated circuit. Most existing designs are not able to achieve these performance goals if very high speed operation is desired.

(Propagation delays on the order of two nanoseconds or less are required). More elaborate designs or processes other than CMOS processes may be used to achieve high speed performance goals, but due to circuit complexity or process characteristics they can add unnecessary power dissipation, increased precious integrated circuit die area, and/or additional expense to the finished integrated circuit.

What is desired, therefore, is a high speed translator circuit that is able to achieve high switching speeds and low propagation delays, but is realized with a design that can be economically implemented in an integrated circuit.

SUMMARY OF THE INVENTION

According to the present invention, a high speed voltage translator circuit includes a voltage divider coupled between first and second power supplies, a transconductance amplifier coupled between third and fourth power supplies including a non-inverting voltage input coupled to the voltage divider, an inverting voltage input for receiving an input signal, and a current output, and a current comparator coupled between the third and fourth power supplies having an input coupled to the current output of the transconductance amplifier, and an output for providing a translated output voltage. The voltage divider includes the series combination of a first p-channel transistor having a coupled gate and drain, and a second p-channel transistor having a coupled gate and drain. The trans-conductance amplifier includes a differential pair of n-channel transistors, a current source for providing current to the differential pair of transistors, first and second p-channel current mirrors coupled to the differential pair of transistors each having a current gain of about five, and an n-channel current mirror coupled to the first and second current mirrors. The current comparator includes a p-channel transistor having a gate coupled to the input of the current comparator, a source coupled to the third power supply, and a drain coupled to the output of the current comparator, and an n-channel transistor having a gate coupled to the input of the current comparator, a source coupled to the fourth power supply, and a drain coupled to the output of the current comparator.

The translated output voltage transitions between the third and fourth power supply voltage levels, the third power supply voltage level being more positive than a first power supply voltage level, and the fourth power supply voltage level being more negative than a second power supply voltage level.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
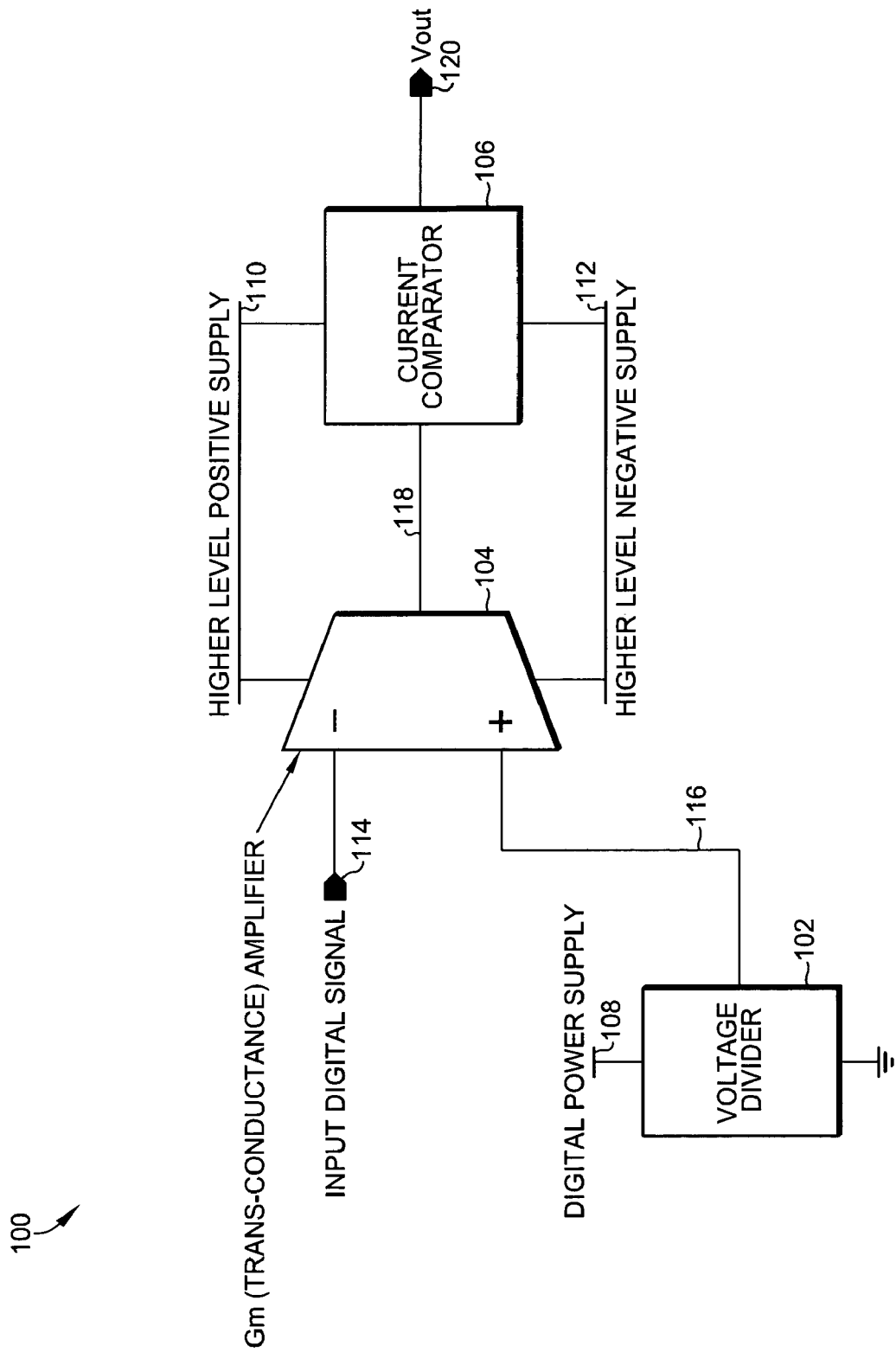
FIG. 1 is a block diagram of a translator circuit according to an embodiment of the present invention including a voltage divider, a transconductance amplifier that is coupled to the voltage divider, and a current comparator coupled to the transconductance amplifier.

Referring now to FIG. 1, a block diagram 100 of an embodiment of the present invention is shown including a voltage divider 102, a transconductance amplifier 104, and a current comparator 106.

In the example of FIG. 1, the voltage divider 102 is powered by a digital power supply 108 and ground, although of course any two power supplies can be used. In a typical example, the power supplies coupled to the voltage divider 102 are lower in value than the power supplies coupled to the transconductance amplifier 104 and the current comparator 106, which is described in further detail below. The output of the voltage divider is provided on line 116.

The transconductance amplifier 104 has a non-inverting voltage input coupled to the output of the voltage divider 102 through line 116, an inverting voltage input for receiving the input digital signal at node 114, and a current output at line 118. The positive power supply 110 coupled to transconductance amplifier 104 is typically a voltage more positive than the digital power supply 108. The negative power supply 112 is typically a voltage below ground.

The current comparator 106 has a current input coupled to the current output of the transconductance amplifier 104 at line 118, and a digital voltage output at node 120. The current comparator 106 is also powered by the higher level positive power supply 110 and the more negative power supply 112.

Figure 2:
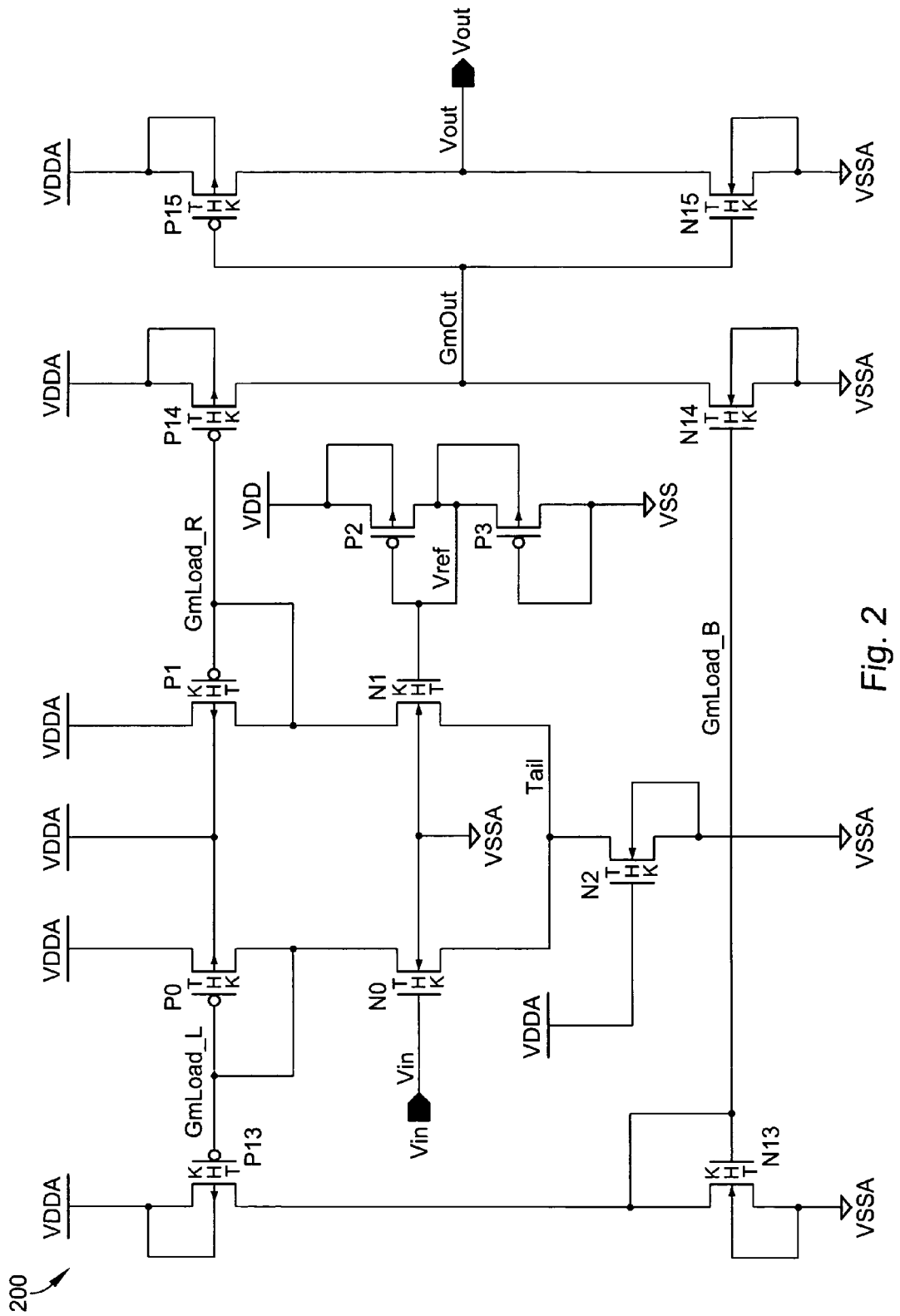
FIG. 2 is a more detailed transistor-level schematic corresponding to the translator circuit shown in block diagram form in FIG. 1.

Referring now to FIG. 2, a more detailed schematic diagram 200 is shown that corresponds generally to the block diagram 100 shown in FIG. 1. The schematic diagram of FIG. 2 includes n-channel transistors N0-N2 and N13-N15, as well as p-channel transistors P0-P3 and P13-P15. In FIG. 2, the VDDA positive power supply corresponds to the positive power supply 110 in FIG. 1. In FIG. 2, the VSSA negative power supply corresponds to the negative power supply 112 in FIG. 1. The VDD and VSS power supplies of FIG. 2 correspond to the digital power supply 108 and ground voltage in FIG. 1. Also in FIG. 1, it should be noted that the "THK" transistor designation refers to a thicker gate oxide on the order of about 70-400 Angstroms, whereas the undesignated transistor symbols have a thinner gate oxide on the order of about 50-70 Angstroms.

Transistors N0 and N1 form a differential pair. The gate of transistor N0 receives the digital VIN input voltage. The gate of transistor N1 receives a voltage from a voltage divider including transistors P2 and P3. Transistors P2 and P3 are each configured such that the gate is coupled to the drain. For each of transistors P2 and P3 the gate is coupled to the drain (diode-connected) and the source tied to the body of the transistor. Transistors P2 and P3 form an ideal voltage divider across temperature, power supply voltage, and process variations. The voltage provided by the resistor divider including transistors P2 and P3 is thus about (VDD+VSS)/2. The tail current for transistors N0 and N1 is provided by transistor N2. Note that the gate of transistor N2 is coupled to VDDA and the source of transistor N2 is coupled to VSSA such that the transistor current is provided by the aspect ratio of the length and width of the transistor. Alternatively, the gate bias of transistor N2 can be adjusted to provide a desired current if desired. The biasing method for transistor N2 shown in FIG. 2 is a convenient method wherein the exact value of the current supplied is not critical. In the example of FIG. 2, the tail current is in the micro-amp range and can be adjusted as required for a particular application.

The drain of transistor N0 is coupled to a p-channel current mirror including diode-connected input transistor P0 and output transistor P13. This current mirror has a current gain of about five since the size of transistor P13 is five times that of transistor P0. The size ratio between transistors P0 and P13 may be adjusted based on a particular application. The drain of transistor N1 is coupled to a p-channel current mirror including diode-connected input transistor P1 and output transistor P14. This current mirror also has a current gain of about five since the size of transistor P14 is five times that of transistor P1. The output current of the P0/P13 current mirror is in turn mirrored by an n-channel current mirror including diode-connected input transistor N13 and output transistor N14. This current mirror has a current gain of about one since the sizes of transistors N13 and N14 are ideally the same. The current outputs of the P1/P14 and N13/N14 current mirrors are summed at the GMOUT node. The GMOUT node represents the output current of the transconductance amplifier.

The output current at the GMOUT node is transformed into a full digital output signal having VDDA and VSSA logic levels at the VOUT node by a current comparator including transistors P15 and N15. The source of transistor P15 is coupled to the VDDA supply, the gate is coupled to the GMOUT node, and the drain is coupled to the VOUT node. The source of transistor N15 is coupled to the VSSA supply, the gate is coupled to the GMOUT node, and the drain is coupled to the VOUT node. In operation, the P15/N15 current comparator uses the small parasitic capacitance, which is multiplied by the Miller Effect, at the GMOUT node to integrate the current output of the transconductance amplifier. In this way, only a small net current is able to provide sufficient voltage drive for turning on either transistor P15 or N15 to provide a full logic level at the VOUT node.

In the example of FIG. 2, the following n-channel transistor sizes are provided:
N0 5 μm×1 μm
N1 5 μm×1 μm
N2 10 μm×1 μm
N13 5×10 μm×1 μm
N14 5×10 μm×1 μm
N15 8×10 μm×1 μm In the example of FIG. 2, the following p-channel transistor sizes are provided:
P0 10 μm×1 μm
P1 10 μm×1 μm
P2 10 μm×1 μm
P3 10 μm×1 μm
P13 5×10 μm×1 μm
P14 5×10 μm×1 μm
P15 8×5 μm×1 μm While transistor sizes are provided, they correspond to a particular CMOS process and may have to be adjusted as required in any particular CMOS process, or may otherwise be adjusted as required by a particular application.

In the example of FIG. 2, the body connection for the n-channel transistors is coupled to VSSA, whereas the body connection for the p-channel transistors is coupled to VDDA, except for transistors P2 and P3, whose body connections are coupled to their respective sources.

Figure 3:
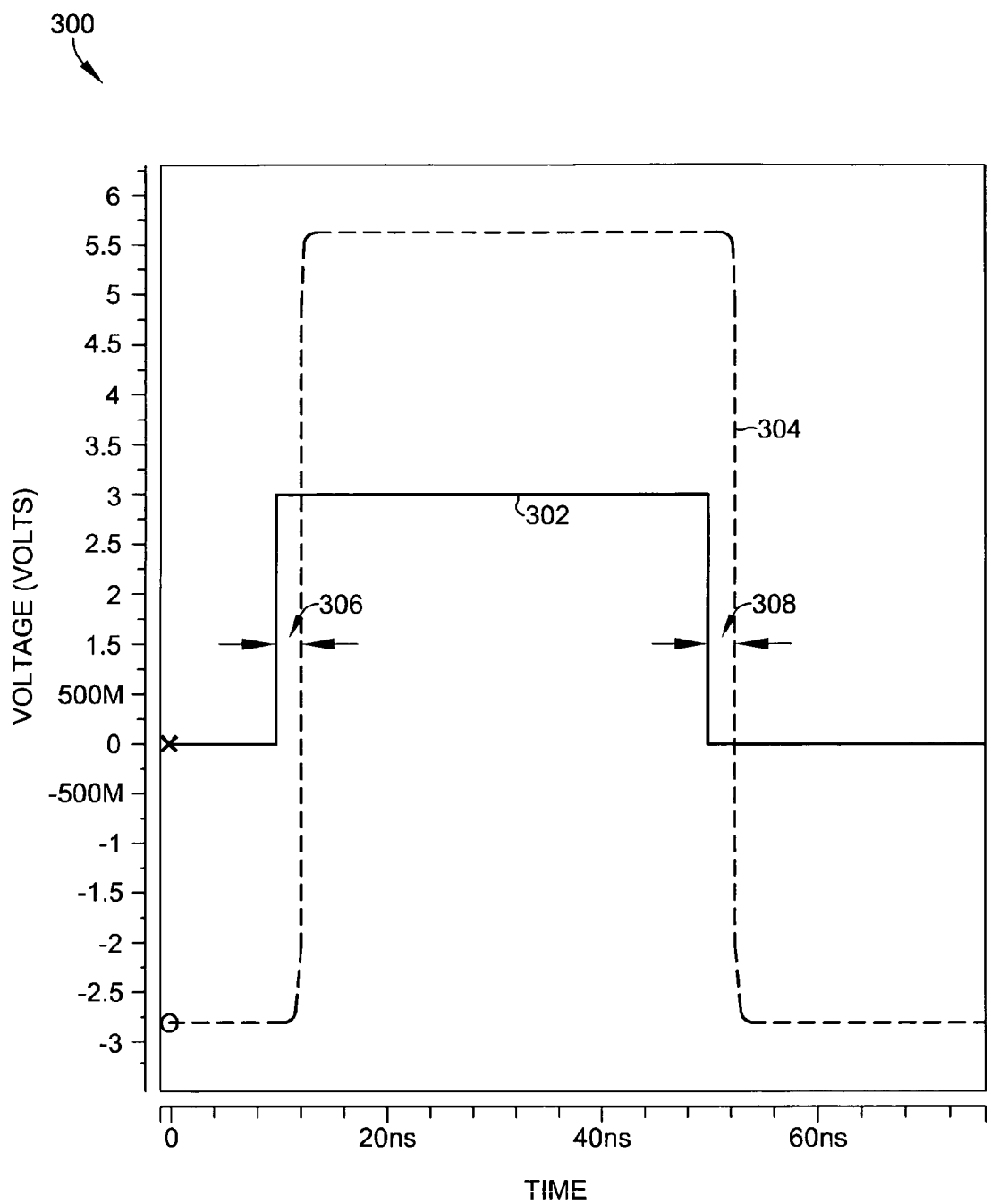
FIG. 3 is a timing diagram of the switching performance of the translator circuit shown in FIG. 2 according to an embodiment of the present invention, showing an input waveform switching between about zero and three volts, and an output waveform switching between about negative three volts and five volts, with propagation delays on the order of two nanoseconds.

Referring now to FIG. 3, a timing diagram 300 shows the high speed performance of the translator circuit of the present invention. An input voltage waveform 302 transitions between a first set of voltages, viz. ground and three volts. The output voltage waveform 304 transitions between a second set of voltages, viz. about −2.8 volts and about 5.6 volts. The input propagation delay 306 is about 2.43 nanoseconds, and the output propagation delay 308 is about 2.35 nanoseconds.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A high speed voltage translator circuit comprising:
   a voltage divider coupled between first and second power supplies;
   a transconductance amplifier coupled between third and fourth power supplies comprising a non-inverting voltage input coupled to the voltage divider, an inverting voltage input for receiving an input signal, and a current output;

a two-transistor current comparator coupled between the third and fourth power supplies having an input only coupled to the current output of the transconductance amplifier and an output for providing a translated output voltage; and wherein the translated output voltage transitions between the third and fourth power supply voltage levels, the third power supply voltage level being more positive than a first power supply voltage level, and the fourth power supply voltage level being more negative than a second power supply voltage level thereby providing substantially simultaneous translation of the third power and the fourth power supply.

2. The high speed voltage translator circuit of claim 1 wherein the voltage divider comprises the series combination of a first p-channel transistor having a coupled gate and drain, and a second p-channel transistor having a coupled gate and drain.

3. The high speed voltage translator circuit of claim 1 wherein the transconductance amplifier comprises:
   a differential pair of transistors;
   a current source for providing current to the differential pair of transistors;
   first and second current mirrors coupled to the differential pair of transistors; and
   a third current mirror coupled to the first and second current mirrors.

4. The high speed voltage translator circuit of claim 3 wherein the differential pair of transistors comprises an n-channel pair of transistors.

5. The high speed voltage translator circuit of claim 3 wherein the current source comprises an n-channel transistor having a drain coupled to the differential pair of transistors, a gate coupled to the third power supply, and a source coupled to the fourth power supply.

6. The high speed voltage translator circuit of claim 3 wherein the first and second current mirrors each comprise a p-channel current mirror.

7. The high speed voltage translator circuit of claim 3 wherein the first and second current mirrors each have a current gain of about five.

8. The high speed voltage translator circuit of claim 3 wherein the third current mirror comprises an n-channel current mirror.

9. The high speed voltage translator circuit of claim 3 wherein the current comparator comprises:
   a p-channel transistor having a gate coupled to the input of the current comparator, a source coupled to the third power supply, and a drain coupled to the output of the current comparator; and
   an n-channel transistor having a gate coupled to the input of the current comparator, a source coupled to the fourth power supply, and a drain coupled to the output of the current comparator.

10. The high speed voltage translator circuit of claim 1 wherein the voltage divider comprises transistors having a first oxide thickness, and the transconductance amplifier and current comparator comprise transistors having a second oxide thickness.

11. A high speed voltage translator circuit comprising:
    a voltage divider having power terminals for being coupled to first and second power supplies;
    a transconductance amplifier having power terminals for being coupled to third and fourth power supplies comprising a non-inverting voltage input coupled to the voltage divider, an inverting voltage input for receiving an input signal, and a current output; and
    a two-transistor current comparator having power terminals for being coupled to the third and fourth power supplies having an input only coupled to the current output of the transconductance amplifier and an output for providing a translated output voltage having less than about 3 nanoseconds of an input propagation delay and less than about 3 nanoseconds of an output propagation delay.

12. The high speed voltage translator circuit of claim 11 wherein the voltage divider comprises the series combination of a first p-channel transistor having a coupled gate and drain, and a second p-channel transistor having a coupled gate and drain.

13. The high speed voltage translator circuit of claim 11 wherein the transconductance amplifier comprises:
    a differential pair of transistors;
    a current source for providing current to the differential pair of transistors;
    first and second current mirrors coupled to the differential pair of transistors; and
    a third current mirror coupled to the first and second current mirrors.

14. The high speed voltage translator circuit of claim 13 wherein the differential pair of transistors comprises an n-channel pair of transistors.

15. The high speed voltage translator circuit of claim 13 wherein the current source comprises an n-channel transistor having a drain coupled to the differential pair of transistors, a gate for coupling to the third power supply, and a source for coupling to the fourth power supply.

16. The high speed voltage translator circuit of claim 13 wherein the first and second current mirrors each comprise a p-channel current mirror.

17. The high speed voltage translator circuit of claim 13 wherein the first and second current mirrors each have a current gain of about five.

18. The high speed voltage translator circuit of claim 13 wherein the third current mirror comprises an n-channel current mirror.

19. The high speed voltage translator circuit of claim 13 wherein the current comparator comprises:
    a p-channel transistor having a gate coupled to the input of the current comparator, a source for coupling to the third power supply, and a drain coupled to the output of the current comparator; and
    an n-channel transistor having a gate coupled to the input of the current comparator, a source for coupling to the fourth power supply, and a drain coupled to the output of the current comparator.

20. The high speed voltage translator circuit of claim 11 wherein the voltage divider comprises transistors having a first oxide thickness, and the transconductance amplifier and current comparator comprise transistors having a second oxide thickness.

* * * * *